(12) United States Patent
Chen et al.

(10) Patent No.: US 9,136,877 B1
(45) Date of Patent: Sep. 15, 2015

(54) SYNDROME LAYERED DECODING FOR LDPC CODES

(71) Applicant: SanDisk Enterprise IP LLC, Milpitas, CA (US)

(72) Inventors: Xiaoheng Chen, San Jose, CA (US); Jiangli Zhu, Sunnyvale, CA (US); Ying Yu Tai, Mountain View, CA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 100 days.

(21) Appl. No.: 13/971,774

(22) Filed: Aug. 20, 2013

Related U.S. Application Data

(60) Provisional application No. 61/800,085, filed on Mar. 15, 2013.

(51) Int. Cl.
*H03M 13/11* (2006.01)
*H03M 13/29* (2006.01)

(52) U.S. Cl.
CPC ...... *H03M 13/1137* (2013.01); *H03M 13/2909* (2013.01)

(58) Field of Classification Search
CPC ............... H03M 13/1131; H03M 13/1137
See application file for complete search history.

(56) References Cited

U.S. PATENT DOCUMENTS

| | | | |
|---|---|---|---|
| 4,173,737 A | 11/1979 | Skerlos et al. | |
| 4,888,750 A | 12/1989 | Kryder et al. | |
| 4,916,652 A | 4/1990 | Schwarz et al. | |
| 5,129,089 A | 7/1992 | Nielsen | |
| 5,270,979 A | 12/1993 | Harari et al. | |
| 5,329,491 A | 7/1994 | Brown et al. | |

(Continued)

FOREIGN PATENT DOCUMENTS

| | | |
|---|---|---|
| EP | 1465203 A1 | 10/2004 |
| EP | 1 990 921 A2 | 11/2008 |

(Continued)

OTHER PUBLICATIONS

International Search Report and Written Opinion dated Jul. 25, 2014, received in International Patent Application No. PCT/US2014/029453, which corresponds to U.S. Appl. No. 13/963,444, 9 pages. (Frayer).

(Continued)

*Primary Examiner* — Steve Nguyen
(74) *Attorney, Agent, or Firm* — Morgan, Lewis & Bockius LLP

(57) ABSTRACT

The various implementations described herein include systems, methods and/or devices for enhancing the performance of error control decoding. The method includes receiving at an LDPC decoder data from a storage medium corresponding to N variable nodes. The method further includes: updating a subset of the N variable nodes; updating all check nodes logically coupled to the updated subset of the N variable nodes; and generating check node output data for each updated check node including at least an updated syndrome check. Finally, the method includes: stopping decoding of the read data in accordance with a determination that the syndrome checks for all the M check nodes are valid syndrome checks or initiating performance of the set of operations with respect to a next subset of the N variable nodes in accordance with a determination that the syndrome checks for all the M check nodes include one invalid syndrome check.

18 Claims, 9 Drawing Sheets

Data Storage Environment 100

(56) References Cited

U.S. PATENT DOCUMENTS

| | | |
|---|---|---|
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevaliier |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,438,459 B2 * | 5/2013 | Cho et al. ............... 714/781 |
| 8,453,022 B2 | 5/2013 | Katz |
| 8,634,248 B1 | 1/2014 | Sprouse et al. |
| 8,694,854 B1 | 4/2014 | Dar et al. |
| 8,898,373 B1 | 11/2014 | Kang et al. |
| 8,923,066 B1 | 12/2014 | Subramanian et al. |
| 2001/0050824 A1 | 12/2001 | Buch |
| 2002/0024846 A1 | 2/2002 | Kawahara et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0093628 A1 | 5/2003 | Matter et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 * | 3/2004 | Zhang et al. ............. 379/399.02 |
| 2004/0062157 A1 | 4/2004 | Kawabe |
| 2004/0073829 A1 | 4/2004 | Olarig |
| 2004/0114265 A1 | 6/2004 | Talbert |
| 2004/0143710 A1 | 7/2004 | Walmsley |
| 2004/0148561 A1 * | 7/2004 | Shen et al. ............... 714/803 |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader et al. |
| 2005/0073884 A1 | 4/2005 | Gonzalez et al. |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 * | 5/2006 | Dave et al. ............... 714/758 |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |

(56) References Cited

U.S. PATENT DOCUMENTS

| | | |
|---|---|---|
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0263442 A1 | 11/2007 | Cornwall et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0037652 A1 | 2/2009 | Yu et al. |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0249160 A1* | 10/2009 | Gao et al. .................. 714/752 |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0153616 A1 | 6/2010 | Garratt |
| 2010/0161936 A1 | 6/2010 | Royer et al. |
| 2010/0174959 A1* | 7/2010 | No et al. .................. 714/746 |
| 2010/0199125 A1 | 8/2010 | Reche |
| 2010/0199138 A1 | 8/2010 | Rho |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0023144 A1 | 1/2012 | Rub |
| 2012/0054414 A1 | 3/2012 | Tsai et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0185750 A1* | 7/2012 | Hayami .................. 714/758 |
| 2012/0195126 A1 | 8/2012 | Roohparvar |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0278564 A1 | 11/2012 | Goss et al. |
| 2012/0284587 A1 | 11/2012 | Yu et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0111279 A1 | 5/2013 | Jeon et al. |
| 2013/0121084 A1 | 5/2013 | Jeon et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0194874 A1 | 8/2013 | Mu et al. |
| 2013/0232289 A1 | 9/2013 | Zhong et al. |
| 2013/0258738 A1 | 10/2013 | Barkon et al. |
| 2013/0265838 A1 | 10/2013 | Li |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0082456 A1 | 3/2014 | Liu |
| 2014/0095775 A1 | 4/2014 | Talagala et al. |
| 2014/0122818 A1 | 5/2014 | Hayasaka et al. |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0269090 A1 | 9/2014 | Flynn et al. |
| 2014/0359381 A1 | 12/2014 | Takeuchi et al. |

FOREIGN PATENT DOCUMENTS

| | | |
|---|---|---|
| EP | 2 620 946 A2 | 7/2013 |
| WO | WO 2009/134576 A1 | 11/2006 |
| WO | WO 2007/036834 A2 | 4/2007 |
| WO | WO 2007/080586 A2 | 7/2007 |
| WO | WO 2008/076292 A2 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |

(56) References Cited

FOREIGN PATENT DOCUMENTS

| WO | WO 200/058140 A1 | 5/2009 |
|----|------------------|--------|
| WO | WO 2009/084724 | 7/2009 |
| WO | WO 2011/024015 | 3/2011 |

OTHER PUBLICATIONS

International Search Report and Written Opinion dated Mar. 7, 2014, received in International Patent Application No. PCT/US2013/074772, which corresponds to U.S. Appl. No. 13/831,218, 10 pages. (George).
International Search Report and Written Opinion dated Mar. 24, 2014, received in International Patent Application No. PCT/US2013/074777, which corresponds to U.S. Appl. No. 13/831,308, 10 pages. (George).
International Search Report and Written Opinion dated Mar. 7, 2014, received in International Patent Application No. PCT/US2013/074779, which corresponds to U.S. Appl. No. 13/831,374, 8 pages. (George).
Barr, Introduction to Watchdog Timers, Oct. 2001, 3 pgs.
Canim, Buffered Bloom ilters on Solid Stage Storage, ADAMS*10, Singapore, Sep. 13-17, 2010, 8 pgs.
Kang, A Multi-Channel Architecture for High-Performance NAND Flash-Based Storage System, J. Syst. Archit., 53, Sep. 9, 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, international Search Report / Written Opinion, PCT/US08/88136, Mar. 19, 2009, 7 pgs.
Pliant Technology, international Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinon, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 17, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Ashkenazi et al., "Platform Independent overall security architecture in multi-processor system-on-chip integrated circuits for use in mobile phones and handheld devices," ScienceDirect, Computers and Electrical Engineering 33 (2007), 18 pages.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinio dated Mar. 9, 2015, received in International Patent Application No. PCT/US2014/059747, which corresponds to U.S. Appl. No. 14/137,440, 9 pages (Fitzpatrick).
International Search Report and Written Opinon dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).

* cited by examiner

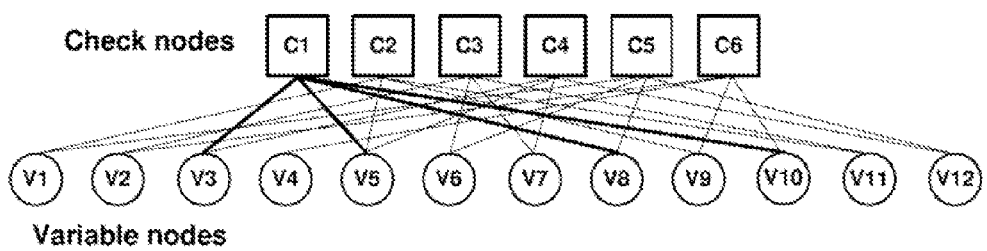
Figure 2A
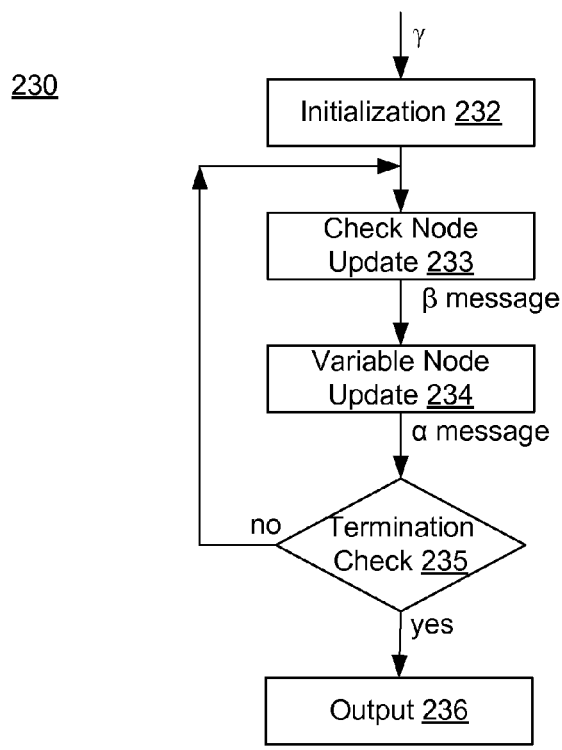
Figure 2B
Figure 2C

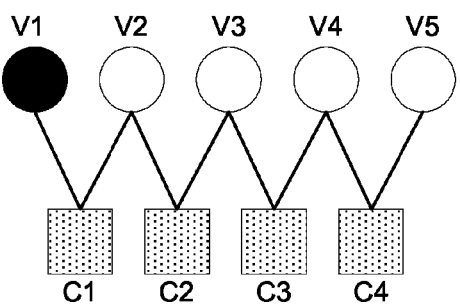
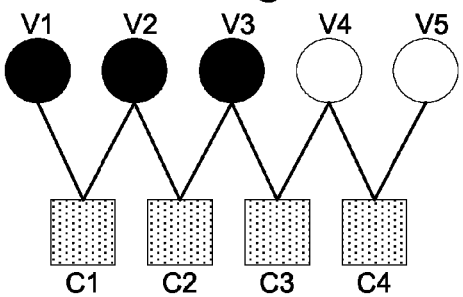
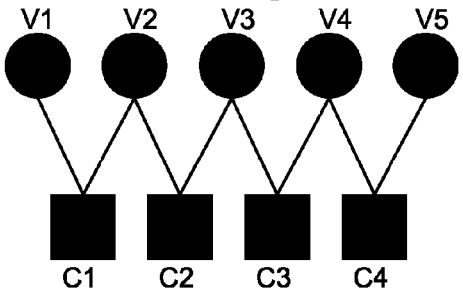
$syndrome\ check = s_m^{k,j}$      $syndrome\ check\ vector = \hat{s} = \begin{bmatrix} s_1^{k,j} \\ s_2^{k,j} \\ s_3^{k,j} \\ s_4^{k,j} \end{bmatrix}$

900

902 At an LDPC decoder with a set of parallel variable node processing units (VNUs) for updating the N variable nodes, where N is an integer, a port coupled to a storage medium, a set of parallel check node processing units (CNUs) for updating M check nodes, where M is an integer, each check node having a respective syndrome check, and control logic coupled with the set of parallel VNUs and the set of parallel CNUs

904 N is defined by the number of columns in a parity-check matrix H, and M is defined by the number of rows in the parity-check matrix H

906 Receive read data from the storage medium at the port, the read data corresponding to the N variable nodes, wherein each of the N variable nodes is logically coupled with a corresponding subset of the M check nodes, and each of the M check nodes is logically coupled with a corresponding subset of the N variable nodes

908 Update via one or more variable node processing units (VNUs) of a set of VNUs a subset of N variable nodes, so as to generate for each updated variable node a respective hard decision bit z and an $\alpha_{nm}$ message

910 Updating via one or more VNUs of the set of parallel VNUs a subset of the N variables nodes includes updating via one or more VNUs of the set of parallel VNUs a subset of the N variables nodes corresponding to a group of columns in the parity-check matrix H in accordance with a column-based decoding schedule

912 Convert via a first converter at least one 2's complement value generated by a respective VNU to a signed-magnitude value for use by a respective CNU

Figure 9A

SYNDROME LAYERED DECODING FOR LDPC CODES

RELATED APPLICATIONS

This application claims priority to U.S. Provisional Patent Application No. 61/800,085, filed Mar. 15, 2013, which is hereby incorporated by reference in its entirety.

TECHNICAL FIELD

The present disclosure relates to using error control codes in memory systems, and in particular, to LDPC codes.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

Error control coding is used to limit the increased likelihood of errors in memory systems. One error control coding option is known as low-density parity check (LDPC) coding. LDPC coding is particularly promising because the generated codewords may be iteratively decoded, which in turn, may improve the error correction capability of the system.

SUMMARY

Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to enable: stopping LDPC decoding prior to updating all variable nodes, or prior to the performance of a complete iteration.

Some implementations include systems, methods and/or devices enabled to update a subset of N variable nodes (e.g., a single variable node or a single column of a parity check matrix). Then, the decoding system is enabled to update all check nodes logically connected to the updated subset of the N variable nodes. The decoding system is enabled to generate, for each updated check node, updated check node output data. The check node output data includes at least an updated syndrome check and, in some implementations, also includes an updated check node message. Next, the decoder is enabled to determine whether the syndrome checks for all M check nodes are valid syndrome checks. In accordance with a determination that the syndrome checks for all the M check nodes are valid syndromes, the decoding system stops decoding the read data. In accordance with a determination that the syndrome checks for all the M check nodes include at least one invalid syndrome check, the decoding system initiates performance of the set of operations with respect to a next subset of the N variable nodes (e.g., the next variable node or the next column of the parity check matrix).

Some implementations include systems, methods and/or devices enabled to generate an updated syndrome check for a respective check node if and only if a hard decision bit received from a respective variable node is different from a previously stored hard decision bit received from the respective variable node.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 2A is a prophetic H matrix, in accordance with some embodiments.

FIG. 2B is a bipartite graph implementation of the H matrix included in FIG. 2A, in accordance with some embodiments.

FIG. 2C is a simplified flowchart of a message passing scheme for an LDPC decoder, in accordance with some embodiments.

FIGS. 5A-5B are representations of a message passing scheme according to a column-based decoding schedule, in accordance with some embodiments.

FIGS. 6A-6B are additional representations of a message passing scheme according to a column-based decoding schedule, in accordance with some embodiments.

FIGS. 7A-7B are additional representations of a message passing scheme according to a column-based decoding schedule, in accordance with some embodiments.

FIGS. 9A-9C are a flowchart representation of a method of stopping decoding read data prior to updating all N variable nodes of an LDPC decoder, in accordance with some embodiments.

Figure 1:
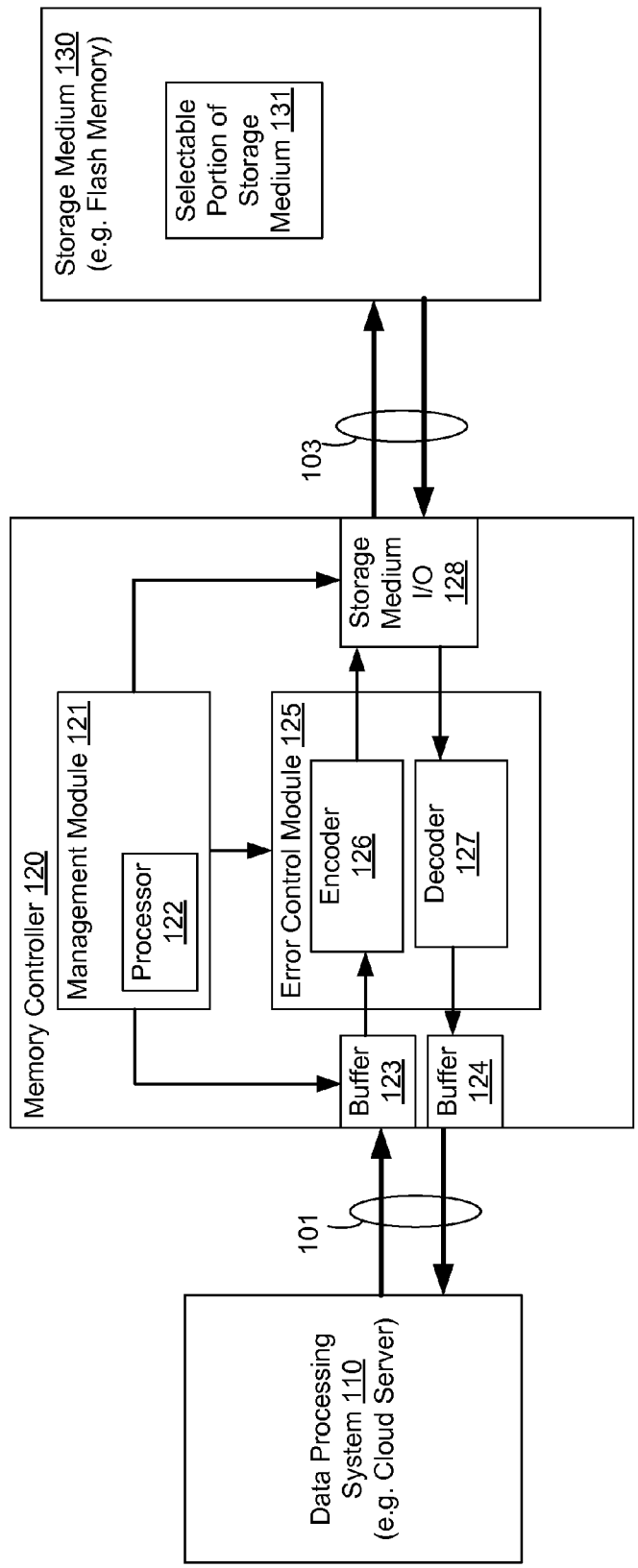
FIG. 1 is a schematic diagram of a data storage environment, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that may enhance the performance of error control codes used to improve the reliability with which data can be stored and read in a storage medium, such as a flash memory. Some implementations include systems, methods and/or devices to stop decoding read data after updating a subset of N variable nodes in accordance with a determination that the syndrome checks for all M check nodes are valid syndrome checks.

More specifically, some implementations include a method performed at an LDPC decoder including: a set of parallel variable node processing units (VNUs) for updating N variable nodes, where N is an integer; a port coupled to a storage medium; a set of parallel check node processing units (CNUs) for updating M check nodes, where M is an integer and each check node has a respective syndrome check; and control logic coupled with the set of parallel VNUs and the set of parallel CNUs. The method includes receiving read data at the port from the storage medium, the read data corresponding to the N variable nodes, where each of the N variable nodes is logically coupled with a corresponding subset of the M check nodes, and each of the M check nodes is logically coupled with a corresponding subset of the N variable nodes. The method further includes updating via one or more VNUs of the set of parallel VNUs a subset of the N variable nodes, so as to generate for each updated variable node a respective new hard decision bit and an $\alpha_{nm}$ message and, in accordance with the new hard decision bits and $\alpha_{nm}$ messages generated for the updated subset of the N variable nodes, updating via one or more CNUs of the set of parallel CNUs all check nodes of the M check nodes logically coupled with the updated subset of the N variable nodes, so as to generate, for each of the updated check nodes, updated check node output data including at least an updated syndrome check. Next, the method includes determining whether the syndrome checks for all the M check nodes are valid syndrome checks. In accordance with a determination that the syndrome checks for all the M check nodes are valid syndrome checks, the method includes stopping decoding the read data. In accordance with a determination that the syndrome checks for all the M check nodes include at least one invalid syndrome check, the method includes initiating performance of the set of operations with respect to a next subset of the N variable nodes In some embodiments, the updated check node output data comprises an updated syndrome check and an updated $\beta_{mn}$ message.

In some embodiments, each CNU is configured to perform processing for a respective check node of the M check nodes, including: receiving, for each variable node of the corresponding subset of the N variable nodes, the $\alpha_{nm}$ message and the new hard decision bit; generating the updated syndrome check; and generating an updated $\beta_{mn}$ message based on the received $\alpha_{nm}$ messages.

In some embodiments, each CNU is configured to forgo generating the updated $\beta_{mn}$ message when the syndrome checks for all the M check nodes are valid syndrome checks.

In some embodiments, the updated $\beta_{mn}$ message is generated using a min-sum algorithm.

In some embodiments, generating the updated syndrome check for a respective check node of the M check nodes comprises performing, for each respective variable node for which the received new hard decision bit is different from a corresponding previously stored hard decision bit, an XOR of a previously stored syndrome, the new hard decision bit for the respective variable node of the corresponding subset of the N variable nodes, and a corresponding previously stored hard decision bit.

In some embodiments, generating the updated syndrome check for a respective check node of the M check nodes comprises identifying variable nodes for which the received new hard decision bit is different from a corresponding previously stored hard decision bit, counting the identified variable nodes, and inverting a previous syndrome check for the respective check node if the count is an odd number.

In some embodiments, N is defined by the number of columns in a parity-check matrix H, and M is defined by the number of rows in the parity-check matrix H. In some embodiments, one or more VNUs of the set of parallel VNUs are enabled to update a subset of the N variables nodes corresponding to a group of columns in the parity-check matrix H in accordance with a column-based decoding schedule.

In some embodiments, the method further comprises: converting via a first converter at least one 2's complement value generated by a respective VNU to a signed-magnitude value for use by a respective CNU; and converting via a second converter at least one signed-magnitude value generated by a respective CNU to a 2's complement value for use by a respective VNU.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100. While some example features are illustrated, those skilled in the art will appreciate from the present disclosure that various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 comprises at least one of NAND-type flash memory and NOR-type flash memory. Further, in some implementations memory controller 120 is a solid-state drive (SSD) controller. However, those skilled in the art will appreciate that various other types of storage media may be included in accordance with aspects of a wide variety of implementations.

Computer system 110 is coupled to memory controller 120 through data connections 101. Moreover, those skilled in the art will appreciate from the present disclosure that in various implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by pseudo-random fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Those skilled in the art will appreciate from the present disclosure that memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). However, those skilled in the art will appreciate from the present disclosure that one or more CPUs 122 may be shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate from the present disclosure that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations, or addresses (e.g., a characterization parameter value of the storage medium), specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

FIG. 2A illustrates an M×N binary matrix called a parity check matrix (H), which defines an LDPC code. The number of columns, N, in H defines the code length. The number of rows, M, in H defines the number of parity check constraints for the code. The information length K of a codeword equals N−M. For a regular LDPC code, the column weight $W_c$ is the number of "1s" per column and row weight $W_r$ is the number of "1s" per row. LDPC codes can also be described by a Tanner (bipartite) graph. The parity check matrix H and the corresponding Tanner graph of a ($W_c$=2, $W_r$=4) (N=12, M=6) LDPC code are shown in FIGS. 2A and 2B, respectively.

In FIG. 2B, there are two sets of nodes: check nodes and variable nodes. Each column of the parity check matrix corresponds to a variable node in the graph represented by $V_n$. Each row of the parity check matrix corresponds to a check node in the graph represented by $C_m$. There is an edge between a check node $C_m$ and a variable node $V_n$ if the position (m, n) in the parity check matrix is a "1," or, in other words, H(m, n)=1.

For example, the first row of the H matrix in FIG. 2A corresponds to $C_1$ of the Tanner graph in FIG. 2B which is connected to variable nodes $V_3$, $V_5$, $V_8$ and $V_{10}$. A variable node which is connected to a check node is called a neighbor variable node. Similarly, a check node that is connected to a variable node is called a neighbor check node.

FIG. 2C illustrates a flowchart of method 230. Method 230 illustrates a simplified, message-passing scheme for iterative LDPC decoding. After obtaining raw read data (γ) from a memory device, the algorithm begins by processing the raw read data and then iteratively correcting the raw read data. First, in block 232, all check node inputs are initialized to "0" or null values. Second, in block 233, a check node update step (sometimes called row processing) is performed to produce $\beta_{mn}$ messages. The variable nodes receive the new $\beta_{mn}$ messages, and then, in block 234, a variable node update step (sometimes called column processing) is performed to produce $\alpha_{nm}$ messages. This process repeats for another iteration by passing the previous iteration's messages to the check nodes. The algorithm finally terminates (termination check, 235) if a maximum number of decoding iterations ($k_{max}$) is reached or a valid code word is detected.

According to some embodiments, a binary codeword $x_b$= ($x_1, x_2, \ldots, x_{cw}$) is stored in a memory device, where cw indicates the codeword length. Then, the codeword is read from the memory device and the read data is $y_b$=($y_1, y_2, \ldots, y_{cw}$). V (m)\n denotes a set of variable nodes connected to check node $C_m$ excluding variable node $V_n$. Similarly, C(n)\m denotes a set of check nodes connected to variable node $V_n$ excluding check node $C_m$. For example, as shown in FIG. 2B, V(1)={$V_3, V_5, V_8, V_{10}$} and V(1)\3={$V_5, V_8, V_{10}$}. Also, C(1)={$C_2, C_5$} and C(1)\2={$C_5$}. $\gamma_n$ is denoted as the information derived from the log-likelihood ratio (LLR) of the read codeword $y_b$ $$\gamma_n = \ln\left(\frac{P(x_b = 0 \mid y_b)}{P(x_b = 1 \mid y_b)}\right). \quad (1)$$

$\beta_{mn}$ is denoted as a decoding message from check node $C_m$ to variable node $V_n$. $\beta_{mn}$ is the check node processing output. $\alpha_{nm}$ is denoted as a decoding message from variable node $V_n$ to check node $C_m$. $\alpha_{nm}$ is the variable node processing output.

In some embodiments, a sum-product algorithm (SPA) is used to decode the raw read data. SPA decoding is summarized by the following four steps:

1. Initialization:

For each variable node $V_n$, initialize $\alpha_{nm}$ to the value of the LLR of the read codeword $y_b$, which is $\gamma_n$ in LLR form. During each iteration, $\alpha_{nm}$ and $\beta_{mn}$ messages are computed and exchanged between variable nodes and check nodes through the graph edges in the Tanner graph (e.g., FIG. 2B) according to the following steps 2-4.

2. Row Processing or Check Node Update:

Compute $\beta_{mn}$ messages using $\alpha_{nm}$ messages from all other variable nodes connected to check node $C_m$, excluding the $\alpha_{nm}$ message from variable node $V_n$:

$$\beta_{mn} = \prod_{n' \in V(m)\backslash n} \text{sign}(\alpha_{n'm}) * \phi\left(\sum_{n' \in V(m)\backslash n} \phi(|\alpha_{n'm}|)\right). \quad (2)$$

The non-linear function $$\phi(x) = -\log\left(\tanh\frac{|x|}{2}\right).$$

The first product term in equation (2) is the parity (sign) bit update and the second product term is the reliability (magnitude) update.

3. Column Processing or Variable Node Update:

Compute $\alpha_{nm}$ messages using an LLR value ($\gamma_n$) of a respective a portion of the read codeword ($y_b$) and incoming $\beta_{mn}$ messages from all other check nodes connected to variable node $V_n$, excluding check node $C_m$.

$$\alpha_{nm} = \gamma_n + \sum_{m' \in C(n)\backslash m} \beta_{m'n} \quad (3)$$

4. Hard Decision Bit Update and Syndrome Check:

When variable node processing is finished, each variable node updates its respective hard decision bit by adding the LLR value ($\gamma_n$) of a respective portion of the read codeword and incoming $\beta_{mn}$ messages from all neighboring check nodes.

$$z_n = \gamma_n + \sum_{m' \in C(n)} \beta_{m'n} \quad (4)$$

From the updated hard decision bits, an estimated code vector, or a syndrome check vector, $\hat{s}$={$s_1, s_2, \ldots, s_b$} is calculated by:

$$s_b = \begin{cases} 1, & \text{if } z_n \leq 0 \\ 0, & \text{if } z_n > 0 \end{cases}. \quad (5)$$

The components ($s_b$) of syndrome check vector ŝ are sometimes called syndrome checks. If ŝ=0, then ŝ is a valid syndrome check vector. Therefore, the iterative decoding process has converged and decoding stops. Otherwise decoding repeats from step 2 until a valid codeword is obtained or the number of iterations reaches a maximum number ($k_{max}$).

In some embodiments, a min-sum algorithm (MSA) is used to decode the raw read data. The MSA simplifies the SPA check node update equation by replacing the computation of the non-linear $\phi(x)$ function with a min(x) function. The min-sum check node update equation is given as:

$$\beta_{mn} = \prod_{n' \in V(m) \backslash n} \text{sign}(\alpha_{n'm}) * \min_{n' \in V(m) \backslash n}(|\alpha_{n'm}|). \quad (6)$$

Each $\beta_{mn}$ message is generated using the $\alpha_{nm}$ messages from all variable nodes connected to check node $C_m$ as defined by H excluding $V_n$. Check node processing requires the exclusion of $V_n$, while calculating the min(x) for $\beta_{mn}$; thus, check node processing necessitates finding both first and second minimums (min1 and min2). In this case min(x) is more precisely defined as follows:

$$\min_{n' \in V(m) \backslash n}(|\alpha_{n'm}|) = \begin{cases} \min 1_{m'} & \text{if } n \neq \text{argmin}(\min 1_m) \\ \min 2_{m'} & \text{if } n = \text{argmin}(\min 1_m) \end{cases} \quad (7)$$

where, $$\min 1_m = \min_{n \in V(m)}(|\alpha_{nm}|) \quad (8)$$

and $$\min 2_m = \min_{n'' \in V(m) \backslash \text{argmin}(\min 1_m)}(|\alpha_{n''m}|) \quad (9)$$

Moreover, the term $\Pi \text{ sign}(\alpha_{n'm})$ is actually a modulo 2 multiplication, or an XOR product, of sign bits. $\Pi \text{ sign}(\alpha_{n'm})$ generates the final sign bit that is in turn concatenated to the magnitude $|\alpha_{nm}|$, whose value is equal to the min(x) function given above in equation (7).

Figure 3:
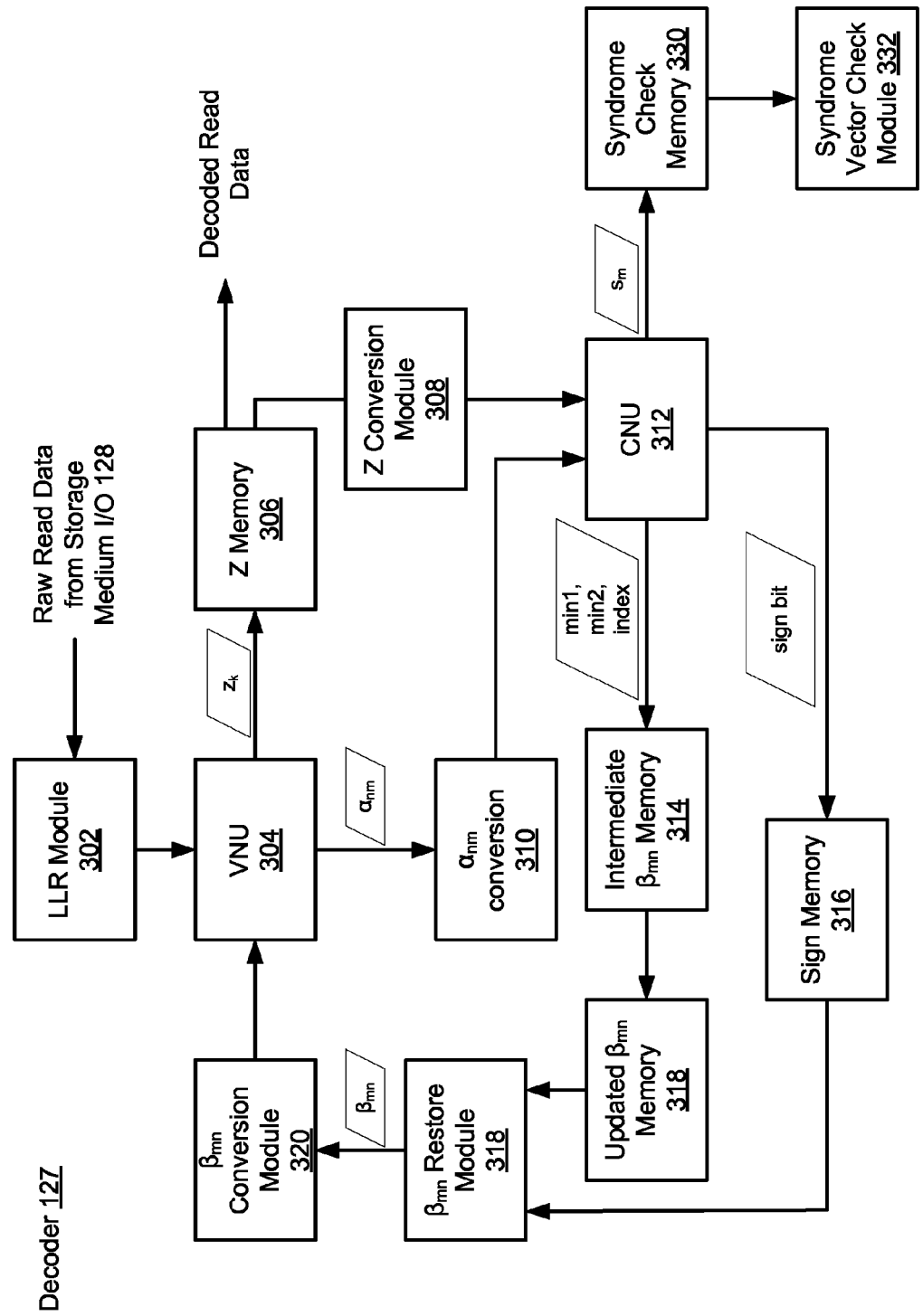
FIG. 3 is a schematic diagram of an implementation of the decoder included in FIG. 1, in accordance with some embodiments.

FIG. 3 is a schematic diagram of an implementation of decoder 127 in FIG. 1. In some embodiments, decoder 127 includes LLR module 302, variable node processing unit (VNU) 304, Z memory 306, Z conversion module 308, $\alpha_{nm}$ conversion module 310, check node processing unit (CNU) 312, intermediate $\beta_{mn}$ memory 314, sign memory 316, updated $\beta_{mn}$ memory 318, $\beta_{mn}$ restore module 318 and $\beta_{mn}$ conversion module 320. In some embodiments, decoder 127 further includes syndrome check memory 330 and syndrome vector check module 332.

LLR module 302 is coupled to storage medium I/O 128 to obtain raw read data including one or more codewords from storage medium I/O 128 associated with N variable nodes. LLR memory 302 converts the raw read data into LLR values.

For example, LLR module 302 implements equation (1) above to produce LLR values. LLR module 302 is further coupled to VNU 304 to provide LLR values to VNU 304. In some implementations, LLR module 302 stores the raw read data associated with N variable nodes until decoding is complete.

VNU 304 is coupled to LLR module 302, Z memory 306, $\alpha_{nm}$ conversion module 310 and $\beta_{mn}$ conversion module 320. VNU 304 is coupled to LLR module 302 to obtain one or more LLR values from LLR module 302, and is coupled to $\beta_{mn}$ conversion module 320 to obtain one or more $\beta_{mn}$ messages from $\beta_{mn}$ conversion module 320. VNU 302 is coupled to provide $\alpha_{nm}$ conversion module 310 with an $\alpha_{nm}$ message and Z memory 306 with a new hard decision bit. VNU 304 is one of a set of parallel variable node processing units for updating the N variable nodes.

In some embodiments, decoder 127 includes a set of parallel variable node processing units (VNUs) for updating the N variable nodes, where N is defined by the number of columns in the H matrix. FIG. 3 illustrates a single VNU 304 for the sake of clarity and brevity, but one skilled in the art will understand how to expand the decoder shown in FIG. 3 to accommodate multiple parallel VNUs that perform their processing operations in parallel. Each VNU is enabled to update, or perform processing for, a subset of the N variable nodes. For example, each VNU performs processing for a single variable node, or each VNU performs processing for N/X of the N variable nodes, where X is an integer less than N.

Each of the N variable nodes (and in turn each of the VNUs) is logically coupled with a corresponding subset of the M check nodes. More specifically, a respective variable node $V_n$ of the N variable nodes is connected with a corresponding subset of the M check nodes, each designated by an "1" in the respective variable node's column of the parity check matrix, or $N(m)=\{n: H_{m,n}=1\}$.

In some embodiments, decoder 127 is configured to enable one or more of the set of parallel VNUs to update a subset of the N variable nodes. In some embodiments, decoder 127 is configured to enable only a single VNU to update a subset of the N variable nodes per clock cycle. To that end, in some implementations, decoder 127 updates a single column of the parity check matrix H, or a single variable node, per clock cycle.

VNU 304 (or a set of parallel VNUs) is configured to update a subset of the N variable nodes (e.g., a single column of the H matrix or a single variable node) so as to generate for each updated variable node a respective new hard decision bit $z_k$, where the subscript k denotes an iteration index, and an $\alpha_{nm}$ message. In some implementations, the new hard decision bit $z_k$ and the $\alpha_{nm}$ message are 2's complement values. In some implementations, VNU 304 is configured to compute the $\alpha_{nm}$ message according to equation (3) above. In some embodiments, VNU 304 is implemented in hardware according to the architecture in FIG. 4A, which is explained in more detail below.

Z memory 306 is coupled to obtain the new hard decision bit generated by VNU 304 and to provide the new hard decision bit to Z conversion module 308. In some implementations, Z memory 306 stores hard decision bits for a respective variable node $V_n$ for each of at least two epochs (e.g., a first epoch corresponding to a current iteration k and a second epoch corresponding to a previous iteration k−1).

Z conversion module 308 is coupled to obtain the new hard decision bit from Z memory 306, and $\alpha_{nm}$ conversion module 310 is coupled to obtain the $\alpha_{nm}$ message from VNU 304. Z conversion module 308 and $\alpha_{nm}$ conversion module 310 are configured to convert 2's complement values generated by VNU 304 into signed-magnitude values for use by CNU 312.

CNU 312 is coupled to Z conversion module 308, $\alpha_{nm}$ conversion module 310, intermediate $\beta_{mn}$ memory 314, sign memory 316 and syndrome check memory 330. CNU 312 is coupled to obtain the $\alpha_{nm}$ message in signed-magnitude form from $\alpha_{nm}$ conversion module 310 and the new hard decision bit in signed-magnitude form from Z conversion module 308. CNU 312 is coupled to provide intermediate $\beta_{mn}$ memory 314 with min1, min2 and index values, sign memory 316 with sign bits and syndrome check memory 330 with an updated syndrome check for a respective check node $C_m$. CNU 312 is one of a set of parallel check node processing units for updating one or more of the M check nodes.

In some embodiments, decoder 127 includes a set of parallel check node processing units (CNUs) for concurrently updating the M check nodes, where M is defined by the number of rows in the H matrix. FIG. 3 illustrates a single CNU 312 for the sake of clarity and brevity, but one skilled in the art will understand how to expand the decoder shown in FIG. 3 to accommodate multiple CNUs. Each CNU is configured to update, or perform processing for, one or more of the M check nodes. For example, each CNU performs processing for a single check node. Alternatively, each CNU performs processing for M/X of the M variable nodes, where X is an integer less than M. In an example of a decoder 127 for decoding codewords having a bit length of 10240 and a 1536× 10240 H matrix, the decoder has 512 CNUs 312 and 128 VNUs. It is noted that the number of CNUs need not be equal to the number of check bits in the codeword divided by an integer, and that the number of VNUs need not be equal to the number of variable bits in the codeword divided by an integer.

Furthermore, each of the M check nodes (and in turn each of the CNUs) is logically coupled with a corresponding subset of the N variable nodes. In other words, a respective check node $C_m$ of the M check nodes is connected with a corresponding subset of the N variable nodes, each designated by a "1" exists in the respective check node's row, or parity check constraint, of the parity check matrix, or $M(n)=\{m: H_{m,n}=1\}$.

In some embodiments, decoder 127 is configured to enable one or more of the set of parallel CNUs to update all check nodes of the M check nodes logically coupled with the updated subset of the N variable nodes. For example, after a subset of the N variable nodes are updated (e.g., a single column of the parity check matrix H or a single variable node), one or more CNUs are enabled to update all check nodes of the M check nodes that are logically coupled with the updated subset of the N variable nodes.

CNU 312 is configured to update a respective check node $C_m$ logically coupled with VNU 304 (among other VNUs not shown), so as to generate updated check node output data including at least an updated syndrome check for the respective check node $C_m$. CNU 312 generates the updated check node output data in accordance with the new hard decision bits and $\alpha_{nm}$ messages obtained from all VNUs (including VNU 304) logically coupled to check node $C_m$. In some embodiments, the updated check node output data includes an updated syndrome check and an updated $\beta_{mn}$ message. In some embodiments, CNU 312 is implemented in hardware according to the architecture in FIG. 4B explained in more detail below.

In some embodiments, CNU 312 computes min1 and min2 values according to equation (7) above. In some implementations, CNU 312 further computes (e.g., in accordance with the pseudo-code shown below) an index value and a sign bit.

In some embodiments, the updated $\beta_{mn}$ message is a mathematical combination of the min1, min2 and index values and the sign bits.

In some embodiments, CNU 312 is configured to compute the updated syndrome check $s_m^{k,j}$ for a respective check node $C_m$. $s_m^{k,j}$ denotes the syndrome check for the respective check node $C_m$ associated with the updated j-th column of the parity check matrix (or the j-th subset of the N variable nodes) in the k-th iteration. In some implementations, the updated syndrome check is computed according to the following equation $s_m^{k,j}=s_m^{k,j-1} \oplus z_j^k \oplus z_j^{k-1}$. Furthermore, $s_m^{k,j}=s_m^{k,j-1} \oplus 1$ when the new hard decision bit $z_j^k$ obtained from the respective VNU in the j-th column of the parity check matrix during the k-th iteration is different from a corresponding previously stored hard decision bit $z_j^{k-1}$. CNU 312 is coupled to provide the updated syndrome check $s_m^{k,j}$ for a respective check node $C_m$ to syndrome check memory 330.

In some embodiments, CNU 312 computes the updated syndrome check only if the new hard decision bit obtained from a respective variable node $V_n$ is different from a corresponding previously stored hard decision bit obtained from the respective variable node. In other words, CNU 312 computes the updated syndrome check only if $z_j^{k-1} \oplus x_j^k=1$, where j corresponds to the updated variable node, or column of the H matrix, from which the hard decision bit was received, k corresponds to the iteration index and $\oplus$ corresponds to modulo 2 addition or an XOR operation. $z_j^{k-1}$ corresponds to the previously stored hard decision bit from the last epoch, or previous iteration, and $z_j^k$ corresponds to the new hard decision bit from the current epoch, or current iteration.

Syndrome check memory 330 is coupled to obtain the updated syndrome check for a respective check node $C_m$ from CNU 312 and to provide the updated syndrome check for the respective check node to syndrome vector check module 332. In some implementations, syndrome check memory 330 is configured to store the syndrome check values for the respective check node $C_m$ for each of at least two epochs (e.g., corresponding to updates of the j-th column of the parity check matrix during first epoch corresponding to a current iteration k and during a second epoch corresponding to a previous iteration k−1).

Syndrome vector check module 332 is coupled to obtain the updated syndrome check for a respective check node $C_m$ (among the updated syndrome checks for all M check nodes) from syndrome check memory 330. After the update of the j-th column of the parity check matrix H in the k-th iteration, syndrome vector check module 332 is configured to compute an updated syndrome check vectors based on the updated syndrome checks for all M check nodes. For example, during the update of the first column (e.g., j=1) during the first iteration (e.g., k=1), $\hat{s}=\{s_1^{1,1}, s_2^{1,1}, \ldots, s_m^{1,1}\}$. Furthermore, decoder 127 is configured to end decoding if $\hat{s}=0$. In some implementations, if $\hat{s}=0$, decoder 127 is configured to enable Z memory 308 to provide the final hard decision bits (e.g., decoded read data) to output buffer 124.

Intermediate $\beta_{mn}$ memory 314 is coupled to obtain intermediate min1, min2 and index values from CNU 312 and to provide updated $\beta_{mn}$ memory 318 with the min1, min2 and index values. Intermediate $\beta_{mn}$ memory 314 is configured to store intermediate min1, min2 and index values obtained from CNU 312 upon the update of all check nodes logically coupled with an updated subset of the N variable nodes (or a column of the H matrix). Intermediate $\beta_{mn}$ memory 314 provides updated $\beta_{mn}$ memory 318 with the min1, min2 and index values upon completion of an iteration, or when all subsets of the N variable nodes (or columns of the H matrix) have been updated.

Updated $\beta_{mn}$ memory 318 is coupled to obtain min1, min2 and index values from intermediate $\beta_{mn}$ memory 314 upon completion of an iteration, or when all subsets of the N variable nodes (or columns of the H matrix) have been updated. In turn, updated $\beta_{mn}$ memory 318 is configured to store the min1, min2 and index values and is coupled to provide the min1, min2 and index values to $\beta_{mn}$ restore module 318.

Sign memory 316 is coupled to obtain sign bits from CNU 312 and to provide $\beta_{mn}$ restore module 318 with the sign bits. Sign memory 316 is configured to store sign bits from CNU 312 upon the update of all check nodes logically coupled with an updated subset of the N variable nodes (or a column of the H matrix) and to provide the sign bits to $\beta_{mn}$ restore module 318 upon completion of an iteration, or when all N variable nodes (or columns of the H matrix) have been updated.

$\beta_{mn}$ restore module 318 is coupled to obtain min1, min2 and index values from updated $\beta_{mn}$ memory 318 and sign bits from sign memory 316 upon completion of an iteration, or when all N variable nodes (or columns of the H matrix) have been updated. $\beta_{mn}$ restore module 318 includes logic configured to generate a $\beta_{mn}$ message for a respective check node $C_m$ in accordance with equation (6) above. $\beta_{mn}$ restore module 318 is configured to mathematically combine the min1, min2 and index values and the sign bits to generate the $\beta_{mn}$ message for the respective check node $C_m$. $\beta_{mn}$ restore module 318 is coupled to provide $\beta_{mn}$ conversion module 320 with the $\beta_{mn}$ message in signed-magnitude form.

$\beta_{mn}$ conversion module 320 is coupled to obtain the $\beta_{mn}$ message from $\beta_{mn}$ restore module 318 and to provide a 2's complement value to VNU 304. $\beta_{mn}$ conversion module 320 is configured to convert a signed-magnitude value (e.g., the $\beta_{mn}$ message) generated by $\beta_{mn}$ restore module 318 to a 2's complement value for use by VNU 304.

In some embodiments, the pseudo-code reproduced below is representative of at least a portion of the implementation of decoder 127 illustrated in FIG. 3. The pseudo-code implements the min-sum algorithm at the check node processing units. Furthermore, the pseudo-code assumes the following definitions: an M×N parity check matrix H includes a set of check nodes N(m)={n: $H_{m,n}$=1} that participate in the parity check and a set of variable nodes (parity check constraint) M(n)={m: $H_{m,n}$=1} connected to the check nodes. Moreover, the raw read data, variable-to-check message, check-to-variable message, and posterior log-likelihood ratio (LLR) are denoted as $\gamma_n$, $\alpha_{n,m}^k$, $\beta_{m,n}^k$ and $\lambda_n^k$ respectively, where the superscript k is the iteration index.

for k=0 to $k_{max}$ or convergence to codeword do
  forall variable nodes $v_n$, n ∈{1, . . . , N} do
    if k=0 then
      $\alpha_{n,m}^k = \gamma_n$;
    else $$\beta_{m,n}^k = \begin{cases} S_m^k \cdot s_{m,n}^k \cdot min1_m^k, & n \neq I_m^k; \\ S_m^k \cdot s_{m,n}^k min2_m^k, & \text{otherwise}; \end{cases}$$

$$\lambda_n^k = \gamma_n + \sum_{m \in M(n)} (\beta_{m,n}^k);$$

$$\alpha_{n,m}^k = \lambda_n^k - \beta_{m,n}^k;$$

end
end

Initialize $min1_m^k = min2_m^k = +\infty, S_m^k = 1$;
forall check nodes $c_m$, m ∈M(n) do
  if $|\alpha_{n,m}^k| < min1_m^{k+1}$ then
    $min1_m^{k+1} = |\alpha_{n,m}^k|$;
    $min2_m^{k+1} = min1_m^{k+1}$;
    $I_m^{k+1} = n$;
  else
    if $|\alpha_{m,n}^k| > min1_m^{k+1}$ then
      $min2_m^{k+1} = |\alpha_{n,m}^k|$;
    end
  end
  $s_{m,n}^{k+1} = Sign(\alpha_{n,m}^k)$;
  $S_m^{k+1} = S_m^k \cdot s_{m,n}^{k+1}$;
end
end In some embodiments, the decoded bits are output as the sign($\lambda_n^k$). Sometimes the decoded bits are called the final hard-decision bits. The first forall loop is, for example, performed at the set of parallel VNUs, including VNU 304. And, the second forall loop is performed, for example, at the set of parallel CNUs, including CNU 312.

In some embodiments, the decoding schedule within each iteration directly follows the above pseudo-code. For example, a subset (e.g., a single variable node or a single column of the H matrix) of the N variable nodes is processed at one time, and all the check nodes are processed in a serial manner interleaved with the variable node processing.

Each newly updated $\alpha_{nm}$ message is directly absorbed by the set of logically coupled CNUs without being intermediately stored. To generate the outgoing $\beta_{mn}$ messages from each check node (i.e., $|\beta_{m,n}^k|$, n ∈N(m)), the sequentialized check node processing only needs to keep track of the two minimum magnitudes (i.e., $min1_m$ and $min2_m$, where $min1_m \leq min2_m$) among the input $\alpha_{nm}$ messages, the variable node index $I_m$ representing which variable node provides the message with the minimum magnitude, the sign $s_{m,n}$ of each input $\alpha_{n,m}$ and $S_m = \Pi s_{m,n}$. The min1, min2 and index values are intermediately stored in intermediate $\beta_{mn}$ memory 314 until all subsets (e.g., all columns of the H matrix) of the N variable nodes have been updated. The sign $s_{m,n}$ of each input $\alpha_{nm}$ and $S_m = \Pi s_{m,n}$ are intermediately stored in sign memory 316 until all subsets (e.g., all columns of the H matrix) of the N variable nodes have been updated. Once all subsets of the N variable nodes have been updated an updated $\beta_{mn}$ message is computed by $\beta_{mn}$ restore module 318 from the intermediately stored min1, min2 and index values and sign bits.

Figure 4A:
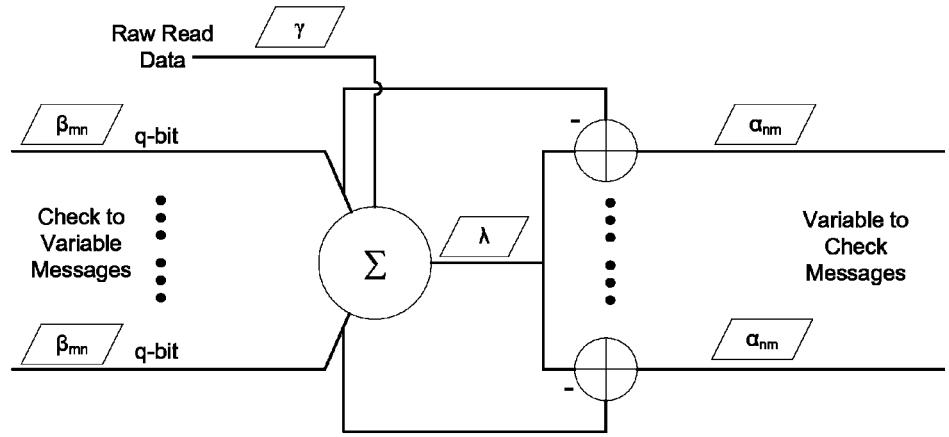
FIG. 4A is a schematic diagram of an implementation of a variable node processing unit (VNU) included in FIG. 3, in accordance with some embodiments.
Figure 4B:
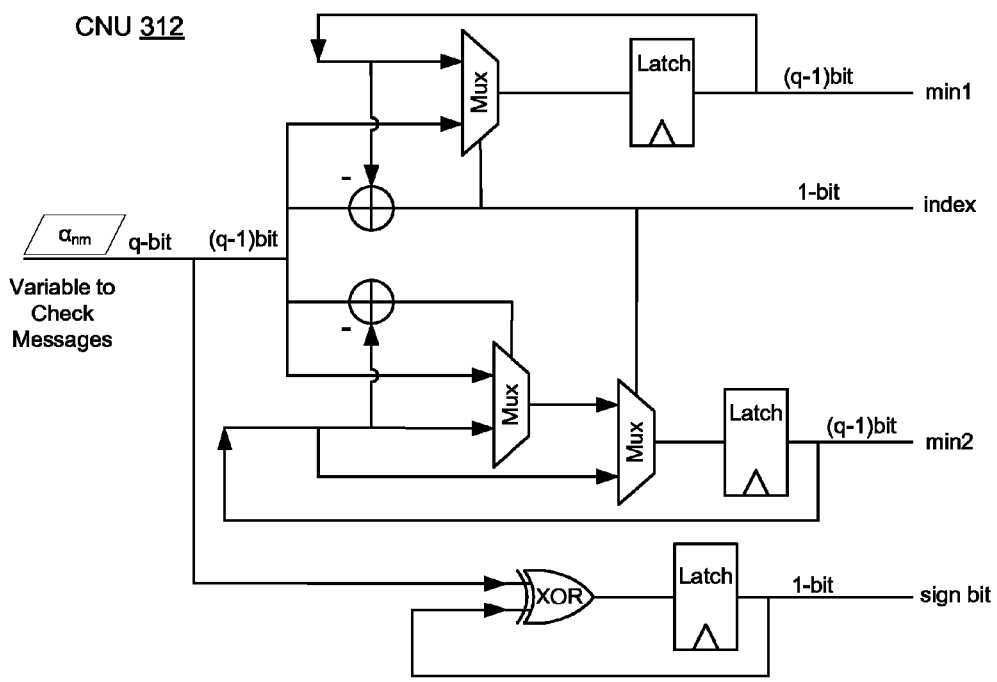
FIG. 4B is a schematic diagram of an implementation of a check node processing unit (CNU) included in FIG. 3, in accordance with some embodiments.

FIG. 4A illustrates an exemplary architecture of VNU 304 included in FIG. 3. FIG. 4A illustrates a hardware implementation of VNU 304 (e.g., configured to update a single variable node or a single column of the H matrix), in accordance with some embodiments. Input $\beta_{mn}$ messages are mathematically combined with a portion of the raw read data ($\gamma$) (e.g., an LLR value) associated with a respective variable node $V_n$ so as to generate $\alpha_{nm}$ messages for all check nodes logically connected with the respective variable node. In FIGS. 4A-4B, q is used to denote the finite word-length of each decoding message.

The architecture of VNU 304 illustrated in FIG. 4A corresponds with a transformed min-sum algorithm as described in H. Zhong, W. Xu, N. Xie, and T. Zhong, "Area-Efficient Min-Sum Decoder Design for High-Rate QC-LDPC Codes in Magnetic Recording," *IEEE Transactions on Magnetics*, vol. 43, no. 12, pp. 4117-4122, December 2007, which is herein incorporated by reference. One skilled in the art will understand how to arrive at the hardware implementation of VNU 304 in FIG. 4A from the first forall loop in the pseudo-code set forth above.

FIG. 4B illustrates an exemplary architecture of CNU 312 included in FIG. 3. FIG. 4B illustrates a hardware implementation of CNU 312 (e.g., configured to update a single check node), in accordance with some embodiments. An input $\alpha_{nm}$ message from a respective updated variable node $V_n$ logically connected to a respective check node $C_m$ is mathematically transformed into min1, min2 and index values and a sign bit. However, in other embodiments, each CNU 312 is configured to receive multiple V node to C node input messages $\alpha_{nm}$ and to update the min1, min2, index and sign bit values based on the multiple received input messages $\alpha_{nm}$.

The architecture of CNU 312 illustrated in FIG. 4B corresponds with a transformed min-sum algorithm as described in H. Zhong, W. Xu, N. Xie, and T. Zhong, "Area-Efficient Min-Sum Decoder Design for High-Rate QC-LDPC Codes in Magnetic Recording," *IEEE Transactions on Magnetics*, vol. 43, no. 12, pp. 4117-4122, December 2007. One skilled in the art will understand how to arrive at the hardware implementation of CNU 312 in FIG. 4B from the second forall loop in the pseudo-code set forth above.

FIGS. 5A-5B illustrate updating the first column (j=1) of a simplified H matrix 500 in accordance with a column-based decoding schedule. FIG. 5A illustrates parity check matrix 500 configured in circulant form. The shaded first column (e.g., j=1) of H matrix 500 is updated in FIGS. 5A-5B.

FIG. 5B illustrates a Tanner (bipartite) graph representation of H matrix 500 with two sets of nodes: variables nodes $V_n$ and check nodes $C_m$. Variable nodes $V_1$, $V_2$, $V_3$, $V_4$, $V_5$ each represent a respective column of H matrix 500. Check nodes $C_1$, $C_2$, $C_3$, $C_4$ each represent a respective row of H matrix 500. In FIG. 5B, the connections between the nodes, or the edges of the graph, are representative of the positions (m, n) in H matrix 500 where $H_{m,n}=1$.

After $V_1$, or the first column j=1 of H matrix 500, is updated (e.g., represented by the black circle), all check nodes logically connected with $V_1$ are updated (e.g., $C_1$). Then, an updated syndrome check $s_m^{k,j}$ is generated for all check nodes logically connected with $V_1$, where k is the iteration index. In turn, after column j=1 is updated, the updated syndrome check for $C_1$ is denoted as $s_1^{k,1}$. Furthermore, an updated syndrome check vector ŝ is computed from the updated syndrome checks—$\{s_1^{k,1}, s_2^{k,1}, s_3^{k,1}, s_4^{k,1}\}$. If a respective check node is not updated because it was not logically connected to a respective updated variable node during the update of the j-th column of the H matrix, then the updated syndrome check for the respective check node is $s_m^{k,j}=s_m^{k,j-1}$. Furthermore, decoder 127 is configured to stop decoding when ŝ=0.

FIGS. 6A-6B illustrate updating the third column (j=3) of simplified H matrix 500 in accordance with a column-based decoding schedule. FIGS. 6A-6B are similar to FIGS. 5A-5B in all respects save the fact that the third column of the H matrix is being updated. Thus, all reference numbers are kept the same and only the differences between FIGS. 6A-6B and 5A-5B are discussed for the sake of brevity.

FIG. 6A illustrates updating the shaded third column (j=3) of H matrix 500. Furthermore, FIG. 6B illustrates that variable nodes $V_1$, $V_2$, $V_3$ have been updated (e.g., represented by the black circles). Thus, during the update of $V_3$ all check nodes logically connected with $V_3$ are updated (e.g., $C_2$ and $C_3$) and updated syndrome check are generated for all check nodes logically connected with $V_3$. The updated syndrome check vector ŝ is computed from the updated syndrome checks—$\{s_1^{k,3}, s_2^{k,3}, s_3^{k,3}, s_4^{k,3}\}$.

FIGS. 7A-7B illustrate updating the shaded fifth column (j=5) of simplified H matrix 500 in accordance with a column-based decoding schedule. FIGS. 7A-7B are similar to FIGS. 5A-5B and 6A-6B in all respects save the fact that the fifth column of the H matrix is being updated. After the update of column j=5 of H matrix 500 in the k-th iteration, the updated syndrome check vectors is computed from the updated syndrome checks—$\{s_1^{k,5}, s_2^{k,5}, s_3^{k,5}, s_4^{k,5}\}$. If a valid codeword is not detected and k≠$k_{max}$, the iteration index in incremented, k=k+1, and the computation process resumes with updating the first column (j=1) again as shown in FIGS. 5A-5B.

Figure 8:
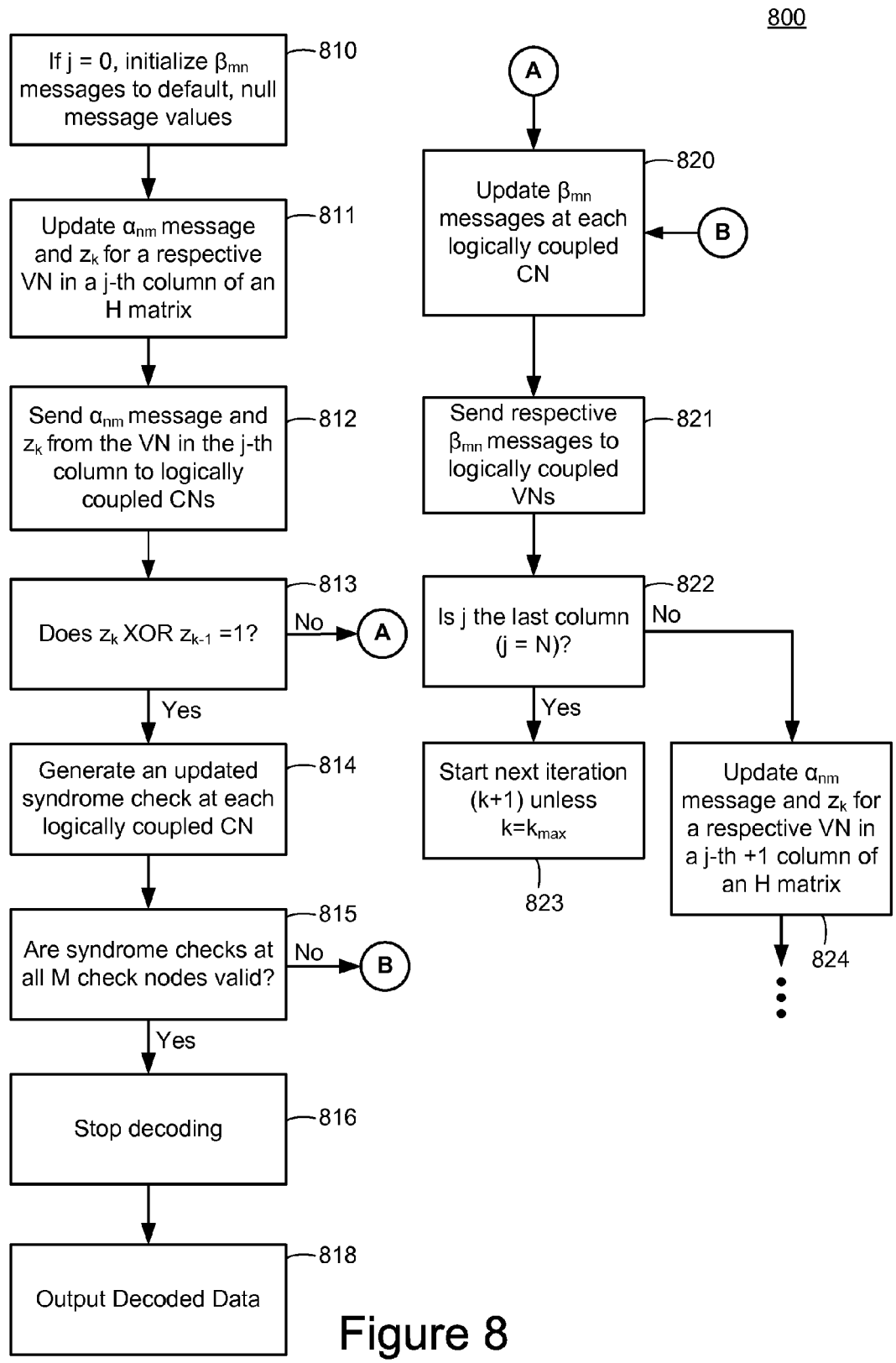
FIG. 8 is a flowchart representation of an implementation of the decoder included in FIG. 3, in accordance with some embodiments.

FIG. 8 is a flowchart representation of a method 800 of LDPC decoding suitable for use with decoder 127 in FIG. 3 in accordance with a column-based decoding schedule. First, as represented by block 810, if the first column of the H matrix is being updated, or j=0, then decoder 127 is configured to initialize all $\beta_{mn}$ messages from check nodes logically connected to a respective variable node $V_n$ as default null, message values.

At block 811, decoder 127 is configured to enable one or more variable node processing units (VNUs) of a set of parallel VNUs to update a respective variable node $V_n$ in a respective j-th column of the H matrix, or a respective subset of the N variable nodes, so as to generate an updated $\alpha_{nm}$ message and a new hard decision bit $z_j^k$ for the respective variable node $V_n$ in the j-th column of the H matrix during the k-th iteration. Next, at block 812 of method 800, decoder 127 is configured to provide the updated $\alpha_{nm}$ message and new hard decision bit $z_{j,k}$ from the respective updated variable node $V_n$ to all check nodes logically connected with the respective updated variable node $V_n$.

At block 813, decoder 127 is configured to enable one or more check node processing units (CNUs) of a set of parallel CNUs to determine at each check node logically connected with the respective updated variable node $V_n$ whether the hard decision bit $z_j^k$ from the respective updated variable node $V_n$ is different from a hard decision bit $z_j^{k-1}$ previously received from the respective updated variable node $V_n$ during iteration k−1. In other words, decoder 127 is configured to perform at each check node logically connected with the respective updated variable node $V_n$ an XOR, or modulo 2 addition, of the new hard decision bit $z_j^k$ from the respective updated variable node $V_n$ during iteration k and a previously received hard decision bit $z_j^{k-1}$ from the respective updated variable node $V_n$ during iteration k−1. If $z_j^k \oplus z_j^{k-1}=1$, where the $\oplus$ operator is representative of an XOR operation, method 800 follows along the "yes" path to block 814, but if $z_j^k \oplus x_j^{k-1} \neq 1$, method 800 follows along the "no" path to block 820.

At block 814, decoder 127 is configured to enable one or more CNUs to generate an updated syndrome check $s_m^{k,j}$ for each check node logically coupled to the respective updated variable node $V_n$. Next, at block 815, decoder 127 is configured to determine (e.g., via syndrome vector check module 332) if the syndrome checks for all M check nodes are valid syndrome checks. In other words, decoder 127 determines whether ŝ=0, where ŝ=$\{s_1^{k,j}, s_2^{k,j}, \ldots s_m^{k,j}\}$. If ŝ=0, method 800 follows along the "yes" path to block 816 (stop decoding). If ŝ≠0, method 800 follows along the "no" path to block 820.

At block 816 of method 800, decoder 127 is configured to stop decoding the raw read data. Next, at block 818, decoder 127 is configured to provide the decoded read data to output buffer 124. In some implementations, the decoded read data is output as the final hard decision bits $\{z_0^k, \ldots, z_j^k, z_{j+1}^{k-1}, \ldots, z_{n-1}^{k-1}\}$ generated during the update of the j-th column of the H matrix in the k-th iteration (e.g., stored in Z memory 306).

At block 820, decoder 127 is configured to enable one or more CNUs to generate an updated $\beta_{mn}$ message at all check nodes logically connected to the respective updated variable node $V_n$. Next, at block 821, decoder 127 is configured to send the updated $\beta_{mn}$ messages to all variables nodes logically coupled with a respective check node $C_m$. At block 822 of method 800, decoder 127 is configured to determine whether the j-th column of the H matrix containing the respective updated variable node $V_n$ is the final column of the H matrix. If the j-th column is the final column of the H matrix, then method 800 follows along the "yes" path to block 823. But, if the j-th column is not the final column of the H matrix, then method 800 follows along the "no" path to block 824.

At block 823, decoder 127 is configured to start the next iteration (k+1) of LDPC decoding process, unless k=$k_{max}$. If k≠$k_{max}$, method 800 will start the decoding process over again at block 810 with j=0 during iteration k+1. If k=$k_{max}$, decoder 127 is configured to stop the decoding process, at which point the decoding process has failed. While such decoding failures are rare, various implementations are configured to undertake remedial measures in such circumstances, such as recalibration of the reading threshold voltages, recalibration of the LLRs, or invoking any other suitable process for addressing the decoding failure.

At block 824, decoder 127 is configured to enable one or more variable node processing units (VNUs) of the set of VNUs to update a respective variable node $V_n$ in the next respective column (j+1) of the H matrix, or the next respective subset of the N variable nodes, so as to generate an updated $\alpha_{nm}$ message and a new hard decision bit $z_{j+1}^k$ for the respective variable node $V_n$ in column j+1 of the H matrix during the k-th iteration. Then, method 800 will continue as above from block 812.

Figure 9B:
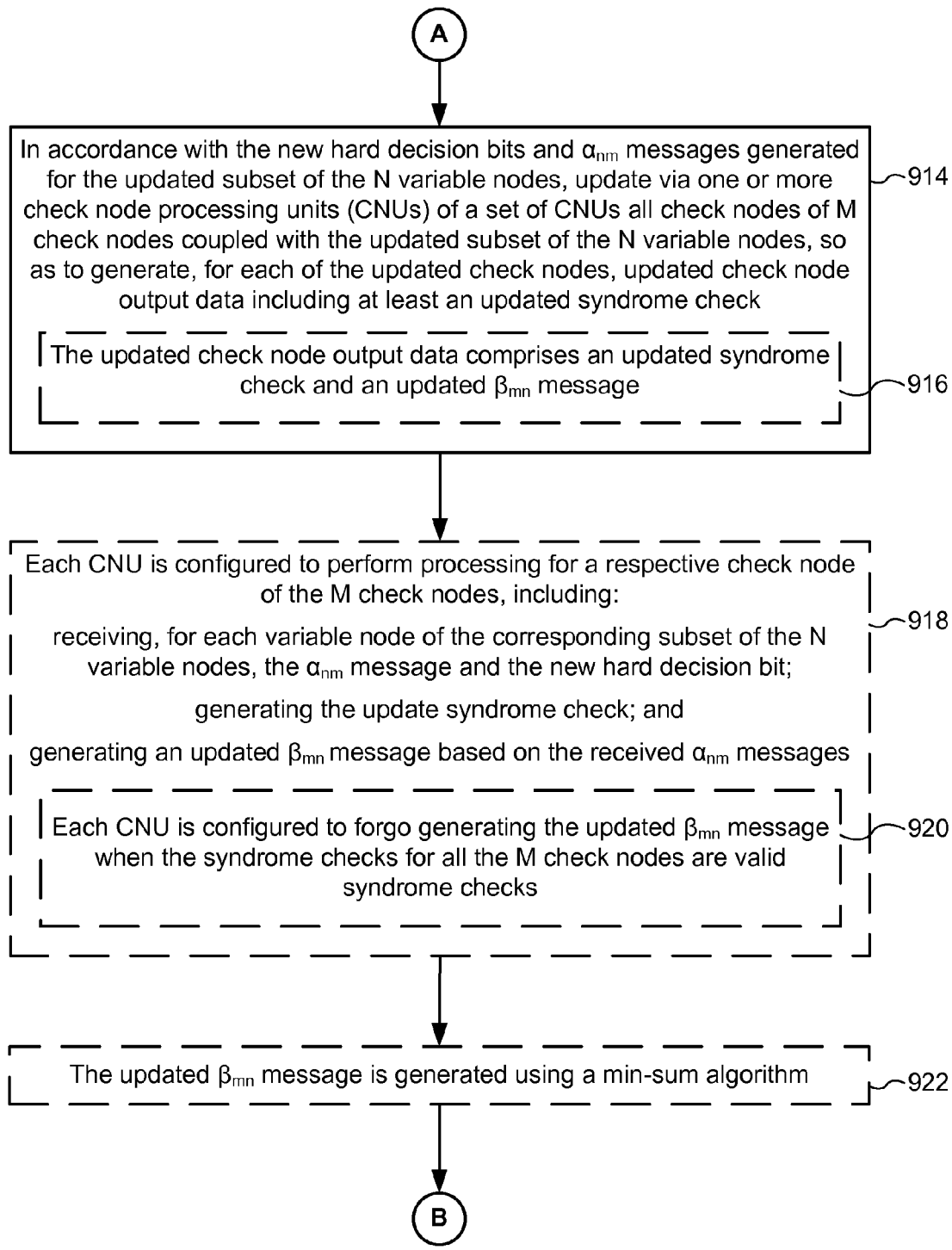
Figure 9C:
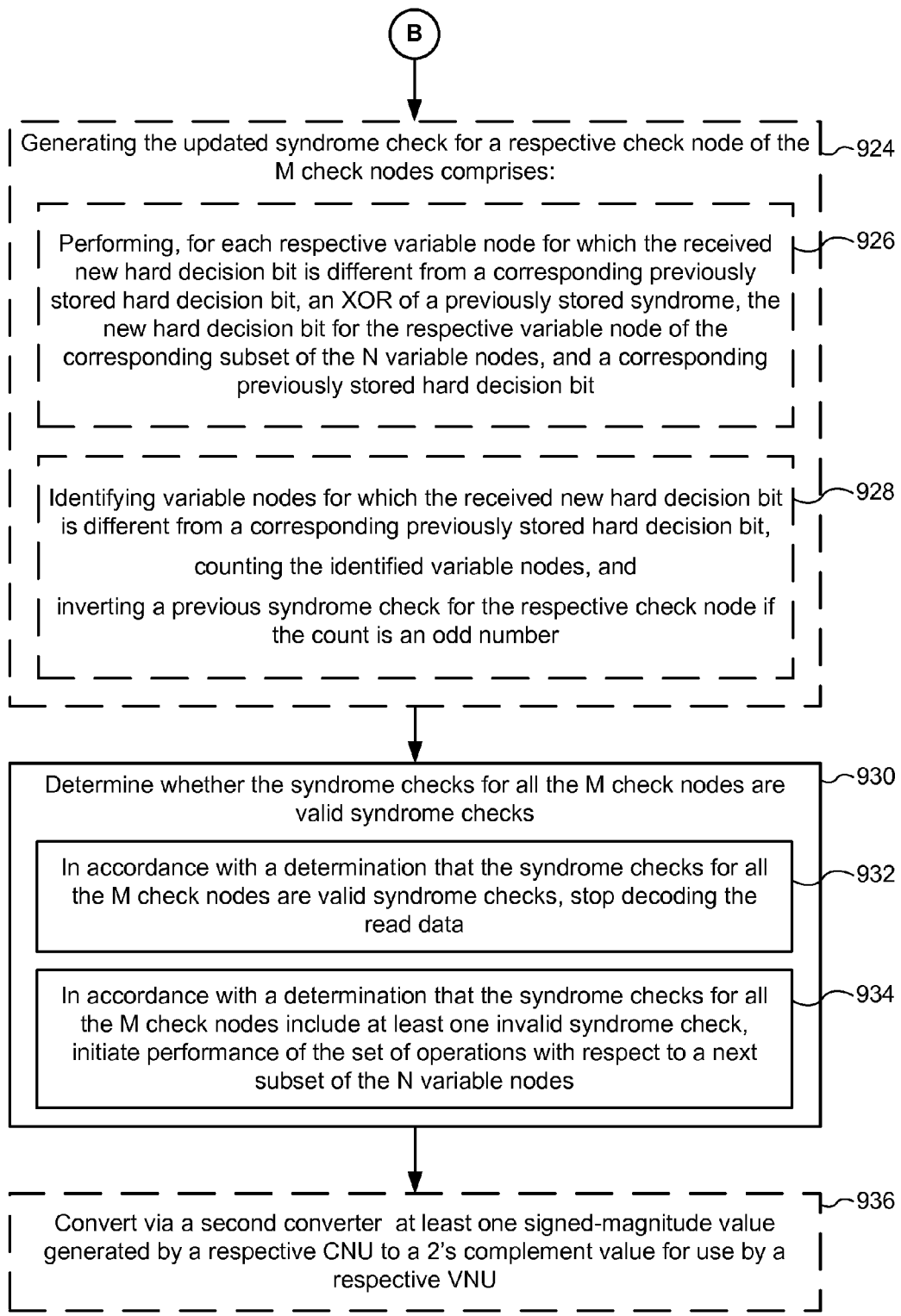

FIGS. 9A-9C illustrate a flowchart representation of method 900 of stopping decoding read data prior to updating all N variable nodes of an LDPC decoder. In some implementations, method 900 is performed by a memory controller (e.g., memory controller 120) or a component of the memory controller (e.g., decoder 127). In some embodiments, method 900 is governed by instructions that are stored in a non-transitory computer readable storage medium and that are executed by one or more processors of a device, such as the one or more processing units (CPUs) 122 of management module 121, shown in FIG. 1.

In some embodiments, method 900 is performed (902) at an LDPC decoder with: a set of parallel variable node processing units (VNUs) for updating N variable nodes, where N is an integer; a port coupled to a storage medium; a set of parallel check node processing units (CNUs) for updating M check nodes, where M is an integer, each check node having a respective syndrome check; and control logic coupled with the set of parallel VNUs and the set of parallel CNUs.

In some embodiments, N is defined (904) by the number of columns in a parity-check matrix H, and M is defined by the number of rows in the parity-check matrix H. FIG. 2A, for example, shows a parity check matrix with 12 columns and 6 rows. FIG. 2B, for example, shows a bipartite graph with 6 check nodes and 12 variable nodes corresponding to the parity check matrix in FIG. 2A.

The decoder receives (906) read data from the storage medium at the port, the read data corresponding to the N variable nodes, where each of the N variable nodes is logically coupled with a corresponding subset of the M check nodes, and each of the M check nodes is logically coupled with a corresponding subset of the N variable nodes. FIG. 3, for example, shows decoder 127 configured to receive raw read data corresponding to the N variables nodes from storage medium I/O 128 at LLR module 302. In turn, LLR module 302 processes the raw read data by converting the raw read data into log-likelihood ratios (LLRs).

The decoder updates (908) via one or more variable node processing units (VNUs) of a set of parallel VNUs a subset of N variable nodes, so as to generate for each updated variable node a respective hard decision bit $z_k$ and an $\alpha_{nm}$ message. FIG. 3, for example, shows VNU 304 (one of the set of VNUs) configured to update a subset of the N variable nodes (e.g., a column j of the H matrix or a single variable node $V_n$). Furthermore, FIG. 3, for example, shows VNU 304 configured to generate a respective hard decision bit $z_k$ and an $\alpha_{nm}$ message for an updated variable node.

In some embodiments, updating via one or more VNUs of the set of parallel VNUs a subset of the N variables nodes includes (910) updating via one or more VNUs of the set of parallel VNUs a subset of the N variables nodes corresponding to a group of columns in the parity-check matrix H in accordance with a column-based decoding schedule. FIG. 3, for example, shows VNU 304 configured update a group of columns (e.g., a single column j corresponding to a single variable node $V_n$) in the parity-check matrix H in accordance with a column-based decoding schedule. In this example, VNU 304 is configured to update a single column j of the parity check matrix H each clock cycle.

In some embodiments, the decoder converts (912) via a first converter at least one 2's complement value generated by a respective VNU to a signed-magnitude value for use by a respective CNU. FIG. 3, for example, shows Z conversion module 308 and $\alpha_{nm}$ conversion module 310 configured to convert a 2's complement value (e.g., the updated $\alpha_{nm}$ message and new hard decision bit) generated by VNU 304 to a signed-magnitude value for use by CNU 312.

In accordance with the new hard decision bits and $\alpha_{nm}$ messages generated for the updated subset of the N variable nodes, the decoder updates (914) via one or more check node processing units (CNUs) of a set of parallel CNUs all check nodes of the M check nodes coupled with the updated subset of the N variable nodes, so as to generate, for each of the updated check nodes, updated check node output data including at least an updated syndrome check. FIG. 3, for example, shows CNU 312 configured to update at least one check node coupled with the updated subset of the N variable nodes. FIG. 3, for example, further shows CNU 312 configured to generate check node output data for a respective check node $C_m$, including at least an updated syndrome check $s_m^{k,j}$ for the respective check node $C_m$.

In some embodiments, the updated check node output data comprises an updated syndrome check and an updated $\beta_{mn}$ message. FIG. 3, for example, shows CNU 312 further configured to generate an updated $\beta_{mn}$ message for a respective check node $C_m$ in addition to updated syndrome check $s_m^{k,j}$ for the respective check node $C_m$.

In some embodiments, each CNU performs (918) processing for a respective check node of the M check nodes, including: receiving, for each variable node of the corresponding subset of the N variable nodes, the $\alpha_{nm}$ message and the new hard decision bit; generating the update syndrome check; and generating an updated $\beta_{mn}$ message based on the received $\alpha_{nm}$ messages. FIG. 3, for example, shows CNU 312 configured to perform processing for a respective check node $C_m$.

In some embodiments, each CNU forgoes (920) generation of the updated $\beta_{mn}$ message when the syndrome checks for all the M check nodes are valid syndrome checks. FIG. 3, for example, shows CNU 312 configured to forgo generation of an updated $\beta_{mn}$ message for a respective check node $C_m$ when syndrome vector check module 332 indicates that the syndrome checks for all the M check nodes are valid syndrome checks.

In some embodiments, the decoder generates (922) the updated $\beta_{mn}$ message using a min-sum algorithm. FIG. 3, for example, shows CNU 312 configured to generate an updated $\beta_{mn}$ message for a respective check node $C_m$ in accordance with a min-sum algorithm by providing min1, min2 and index values to intermediate $\beta_{mn}$ memory 314 and sign bits to sign memory 316.

In some embodiments, the decoder generates (924) the updated syndrome check for a respective check node of the M check nodes by performing (926), for each respective variable node for which the received new hard decision bit is different from a corresponding previously stored hard decision bit, an XOR of a previously stored syndrome, the new hard decision bit for the respective variable node of the corresponding subset of the N variable nodes, and a corresponding previously stored hard decision bit. FIG. 3, for example, shows CNU 312 configured to generate an updated syndrome check $s_m^{k,j}$ for a respective check node $C_m$ by performing a XOR of a previously stored syndrome $s_m^{k,j-1}$, the new hard decision bit $z_j^k$ for the respective variable node of the corresponding subset of the N variable nodes and a corresponding previously stored hard decision bit $z_j^{k-1}$. In other words, $s_m^{k,j}=s_m^{k,j-1}\oplus z_j^k \oplus z_j^{k-1}$. In this example, CNU 312 is configured to generate the updated syndrome check when the received new hard decision bit $z_j^k$ is different from a corresponding previously stored hard decision bit $z_j^{k-1}$. In other words, CNU 312 is configured to generate the updated syndrome check when $z_j^k \oplus z_j^{k-1}=1$. Furthermore, if $z_j^k \oplus z_j^{k-1} \neq 1$, then $s_m^{k,j}=s_m^{k,j-1}$.

In some embodiments, the decoder generates (924) the updated syndrome check for a respective check node of the M check nodes by identifying (928) variable nodes for which the received new hard decision bit is different from a corresponding previously stored hard decision bit, counting the identified variable nodes, and inverting a previous syndrome check for the respective node if the count is an odd number. FIG. 3, for example, shows CNU 312 configured to generate an updated syndrome check $s_m^{k,j}$ for a respective check node $C_m$ by identifying variable nodes for which the received new hard decision bit ($z_k$ is different from a corresponding previously stored hard decision bit $z_j^{k-1}$, counting the identified variable nodes, and inverting a previous syndrome check $s_m^{k,j-1}$ for the respective check node $C_m$ if the count is an odd number. Furthermore, if the count is equal to zero or an even number, the updated syndrome check is the previously generated syndrome check for the respective check node $C_m$ or, in other words, $s_m^{k,j}=s_m^{k,j-1}$.

The decoder determines (930) whether the syndrome checks for all the M check nodes are valid syndrome checks. FIG. 3, for example, shows syndrome vector check module 332 configured to determine whether the syndrome checks for all the M check nodes are valid syndrome checks.

In accordance with a determination that the syndrome checks for all the M check nodes are valid syndrome checks, the decoder stops (932) decoding the read data. FIG. 3, for example, shows decoder 127 configured to stop decoding the read data if syndrome vector check module 332 determines that the syndrome checks for all the M check nodes are valid syndrome checks. In this example, if syndrome vector check module 332 determines that $\hat{s}=0$, where $\hat{s}=\{s_1^{k,j}, s_2^{k,j}, \ldots, s_m^{k,j}\}$, then decoder 127 stops decoding the read data.

In accordance with a determination that the syndrome checks for all the M check nodes include at least one invalid syndrome check, the decoder initiates (934) performance of the set of operations with respect to a next subset of the N variable nodes. FIG. 3, for example, shows decoder 127 configured to initiate performance of the set of operations with respect to a next subset of the N variable nodes (e.g., VNU 304 updates column j+1 of the H matrix, or the next respective variable node $V_n$) if syndrome vector check module 332 determines that $\hat{s}\neq 0$, where $\hat{s}=\{s_1^{k,j}, s_2^{k,j}, \ldots, s_m^{k,j}\}$.

In some embodiments, the decoder converts (936) via a second converter at least one signed-magnitude value generated by a respective CNU to a 2's complement value for use by a respective VNU. FIG. 3, for example, shows $\beta_{mn}$ conversion module 320 configured to convert a signed-magnitude value (e.g., the updated $\beta_{mn}$ message) generated by CNU 312 to a 2's complement value for use by VNU 304.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An LDPC error control decoding system, comprising:
   a set of parallel variable node processing units (VNUs) for updating N variable nodes, wherein N is an integer;
   a port for receiving read data from a storage medium, the read data corresponding to the N variable nodes;

a set of parallel check node processing units (CNUs) for updating M check nodes, wherein M is an integer, each check node having a respective syndrome check;

wherein each of the N variable nodes is logically coupled with a corresponding subset of the M check nodes, and each of the M check nodes is logically coupled with a corresponding subset of the N variable nodes;

control logic coupled with the set of parallel VNUs and the set of parallel CNUs, configured to perform a set of operations, including:

enabling one or more VNUs of the set of parallel VNUs to update a subset of the N variable nodes, so as to generate for each updated variable node a respective new hard decision bit and an $\alpha_{nm}$ message;

enabling one or more CNUs of the set of parallel CNUs to update all check nodes of the M check nodes logically coupled with the updated subset of the N variable nodes, in accordance with the new hard decision bits and $\alpha_{nm}$ messages generated for the updated subset of the N variable nodes, so as to generate, for each of the updated check nodes, updated check node output data including at least an updated syndrome check, wherein generating the updated syndrome check for a respective check node of the M check nodes comprises identifying variable nodes for which the received new hard decision bit is different from a corresponding previously stored hard decision bit, counting the identified variable nodes, and inverting a previous syndrome check for the respective check node in accordance with a determination that the count is an odd number;

determining whether the syndrome checks for all the M check nodes are valid syndrome checks;

in accordance with a determination that the syndrome checks for all the M check nodes are valid syndromes, stopping decoding the read data; and in accordance with a determination that the syndrome checks for all the M check nodes include at least one invalid syndrome check, initiating performance of the set of operations with respect to a next subset of the N variable nodes.

2. The LDPC error control decoding system of claim 1, wherein the updated check node output data comprises an updated syndrome check and an updated $\beta_{mn}$ message.

3. The LDPC error control decoding system of claim 1, wherein each CNU is configured to perform processing for a respective check node of the M check nodes, including:

receiving, for each variable node of the corresponding subset of the N variable nodes, the $\alpha_{nm}$ message and the new hard decision bit;

generating the updated syndrome check; and generating an updated $\beta_{mn}$ message based on the received $\alpha_{nm}$ messages.

4. The LDPC error control decoding system of claim 3, wherein each CNU is configured to forgo generating the updated $\beta_{mn}$ message when the syndrome checks for all the M check nodes are valid syndrome checks.

5. The LDPC error control decoding system of claim 1, wherein the updated $\beta_{mn}$ message is generated using a min-sum algorithm.

6. The LDPC error control decoding system of claim 1, wherein N is defined by the number of columns in a parity-check matrix H, and M is defined by the number of rows in the parity-check matrix H.

7. The LDPC error control decoding system of claim 6, wherein one or more VNUs of the set of parallel VNUs are enabled to update a subset of the N variables nodes corresponding to a group of columns in the parity-check matrix H in accordance with a column-based decoding schedule.

8. The LDPC error control decoding system of claim 1, further comprising:

a first converter to convert at least one 2's complement value generated by a respective VNU to a signed-magnitude value for use by a respective CNU; and a second converter to convert at least one signed-magnitude value generated by a respective CNU to a 2's complement value for use by a respective VNU.

9. An LDPC error control decoding system, comprising:

a set of parallel variable node processing units (VNUs) for updating N variable nodes, wherein N is an integer;

a port for receiving read data from a storage medium, the read data corresponding to the N variable nodes;

a set of parallel check node processing units (CNUs) for updating M check nodes, wherein M is an integer, each check node having a respective syndrome check;

wherein each of the N variable nodes is logically coupled with a corresponding subset of the M check nodes, and each of the M check nodes is logically coupled with a corresponding subset of the N variable nodes;

control logic coupled with the set of parallel VNUs and the set of parallel CNUs, configured to perform a set of operations, including:

enabling one or more VNUs of the set of parallel VNUs to update a subset of the N variable nodes, so as to generate for each updated variable node a respective new hard decision bit and an $\alpha_{nm}$ message;

enabling one or more CNUs of the set of parallel CNUs to update all check nodes of the M check nodes logically coupled with the updated subset of the N variable nodes, in accordance with the new hard decision bits and $\alpha_{nm}$ messages generated for the updated subset of the N variable nodes, so as to generate, for each of the updated check nodes, updated check node output data including at least an updated syndrome check wherein generating the updated check node output data including at least an updated syndrome check, wherein generating the updated syndrome check for a respective check node of the M check nodes comprises identifying each respective variable node for which the received new hard decision bit is different from a corresponding previously stored hard decision bit, and performing an XOR of a previously stored syndrome, with only the new hard decision bit for the each identified respective variable node of the corresponding subset of the N variable nodes, and a corresponding previously stored hard decision bit for each identified respective variable node of the corresponding subset of the N variable nodes;

determining whether the syndrome checks for all the M check nodes are valid syndrome checks;

in accordance with a determination that the syndrome checks for all the M check nodes are valid syndromes, stopping decoding the read data; and in accordance with a determination that the syndrome checks for all the M check nodes include at least one invalid syndrome check, initiating performance of the set of operations with respect to a next subset of the N variable nodes.

10. A method of LDPC error control decoding, the method comprising:

at an LDPC decoder with a set of parallel variable node processing units (VNUs) for updating N variable nodes, wherein N is an integer, a port coupled to a storage medium, a set of parallel check node processing units (CNUs) for updating M check nodes, wherein M is an integer, each check node having a respective syndrome check, and control logic coupled with the set of parallel VNUs and the set of parallel CNUs;

receiving read data from the storage medium at the port, the read data corresponding to the N variable nodes, wherein each of the N variable nodes is logically coupled with a corresponding subset of the M check nodes, and each of the M check nodes is logically coupled with a corresponding subset of the N variable nodes;

updating via one or more VNUs of the set of parallel VNUs a subset of the N variable nodes, so as to generate for each updated variable node a respective new hard decision bit and a $\alpha_{nm}$ message;

in accordance with the new hard decision bits and $\alpha_{nm}$ messages generated for the updated subset of the N variable nodes, updating via one or more CNUs of the set of parallel CNUs all check nodes of the M check nodes logically coupled with the updated subset of the N variable nodes, so as to generate, for each of the updated check nodes, updated check node output data including at least an updated syndrome check, wherein generating the updated syndrome check for a respective check node of the M check nodes comprises identifying variable nodes for which the received new hard decision bit is different from a corresponding previously stored hard decision bit, counting the identified variable nodes, and inverting previous syndrome check for the respective check node in accordance with a determination that the count is an odd number;

determining whether the syndrome checks for all the M check nodes are valid syndrome checks;

in accordance with a determination that the syndrome checks for all the M check nodes are valid syndrome checks, stopping decoding the read data; and in accordance with a determination that the syndrome checks for all the M check nodes include at least one invalid syndrome check, initiating performance of the set of operations with respect to a next subset of the N variable nodes.

11. The method of claim 10, wherein the updated check node output data comprises an updated syndrome check and an updated $\beta_{mn}$ message.

12. The method of claim 10, wherein each CNU is configured to perform processing for a respective check node of the M check nodes, including:
receiving, for each variable node of the corresponding subset of the N variable nodes, the $\alpha_{nm}$ message and the new hard decision bit;
generating the updated syndrome check; and
generating an updated $\beta_{mn}$ message based on the received $\alpha_{nm}$ messages.

13. The method of claim 12, wherein each CNU is configured to forgo generating the updated $\beta_{mn}$ message when the syndrome checks for all the M check nodes are valid syndrome checks.

14. The method of claim 10, wherein the updated $\beta_{mn}$ message is generated using a min-sum algorithm.

15. The method of claim 10, wherein N is defined by the number of columns in a parity-check matrix H, and M is defined by the number of rows in the parity-check matrix H.

16. The method of claim 15, wherein updating via one or more VNUs of the set of parallel VNUs a subset of the N variables nodes includes updating via one or more VNUs of the set of parallel VNUs a subset of the N variables nodes corresponding to a group of columns in the parity-check matrix H in accordance with a column-based decoding schedule.

17. The method of claim 10, further comprising:
converting via a first converter at least one 2's complement value generated by a respective VNU to a signed-magnitude value for use by a respective CNU; and
converting via a second converter at least one signed-magnitude value generated by a respective CNU to a 2's complement value for use by a respective VNU.

18. A method of LDPC error control decoding, the method comprising:

at an LDPC decoder with a set of parallel variable node processing units (VNUs) for updating N variable nodes, wherein N is an integer, a port coupled to a storage medium, a set of parallel check node processing units (CNUs) for updating M check nodes, wherein M is an integer, each check node having a respective syndrome check, and control logic coupled with the set of parallel VNUs and the set of parallel CNUs;

receiving read data from the storage medium at the port, the read data corresponding to the N variable nodes, wherein each of the N variable nodes is logically coupled with a corresponding subset of the M check nodes, and each of the M check nodes is logically coupled with a corresponding subset of the N variable nodes;

updating via one or more VNUs of the set of parallel VNUs a subset of the N variable nodes, so as to generate for each updated variable node a respective new hard decision bit and a $\alpha_{nm}$ message;

in accordance with the new hard decision bits and $\alpha_{nm}$ messages generated for the updated subset of the N variable nodes, updating via one or more CNUs of the set of parallel CNUs all check nodes of the M check nodes logically coupled with the updated subset of the N variable nodes, so as to generate, for each of the updated check nodes, updated check node output data including at least an updated syndrome check, wherein generating the updated syndrome check for a respective check node of the M check nodes comprises identifying each respective variable node for which the received new hard decision bit is different from a corresponding previously stored hard decision bit, and performing an XOR of a previously stored syndrome, with only the new hard decision bit for each identified respective variable node of the corresponding subset of the N variable nodes, and a corresponding previously stored hard decision bit for each identified respective variable node of the corresponding subset of the N variable nodes;

determining whether the syndrome checks for all the M check nodes are valid syndrome checks;

in accordance with a determination that the syndrome checks for all the M check nodes are valid syndrome checks, stopping decoding the read data; and in accordance with a determination that the syndrome checks for all the M check nodes include at least one invalid syndrome check, initiating performance of the set of operations with respect to a next subset of the N variable nodes.

* * * * *

UNITED STATES PATENT AND TRADEMARK OFFICE
CERTIFICATE OF CORRECTION

| | | |
|---|---|---|
| PATENT NO. | : 9,136,877 B1 | Page 1 of 1 |
| APPLICATION NO. | : 13/971774 | |
| DATED | : September 15, 2015 | |
| INVENTOR(S) | : Chen et al. | |

It is certified that error appears in the above-identified patent and that said Letters Patent is hereby corrected as shown below:

In the claims,

Claim 9, col. 22, line 46, please delete "bit for the" and insert --bit for--;

Claim 10, col. 23, line 29, please delete "inverting previous" and insert --inverting a previous--.

Signed and Sealed this
Fifteenth Day of March, 2016

Michelle K. Lee
*Director of the United States Patent and Trademark Office*